United States Patent [19]
Collins et al.

[11] 4,384,346
[45] May 17, 1983

[54] THIN FILM MAGNETO-RESISTIVE APPARATUS FOR EFFECTING READOUT FROM MAGNETIC MEMORY DEVICES

[75] Inventors: Alan J. Collins, Risca, Wales; John D. R. McQuillin, Malvern, England

[73] Assignee: The Secretary of State for Industry in Her Britannic Majesty's Government of the United Kingdom of Great Britain and Northern Ireland, London, England

[21] Appl. No.: 213,754

[22] Filed: Dec. 5, 1980

Related U.S. Application Data

[63] Continuation-in-part of Ser. No. 7,448, Jan. 29, 1979.

[30] Foreign Application Priority Data

Jan. 30, 1978 [GB] United Kingdom ............... 3591/78

[51] Int. Cl.³ .................................................. G11G 7/00
[52] U.S. Cl. ........................................ 365/189; 365/6; 365/199; 365/206
[58] Field of Search ................. 365/6, 199, 206, 209, 365/210, 80, 87, 189; 328/127, 151; 307/353; 178/69 R, 69 A, 69 G, 70 R, 71 T; 340/146, 1 R, 1 BA

[56] References Cited

U.S. PATENT DOCUMENTS

| Re. 30,087 | 8/1979 | White et al. | 307/353 |
| 3,396,369 | 8/1968 | Brothman | 340/146.1 R |
| 3,603,746 | 9/1971 | Heick | 178/69 A |
| 3,780,312 | 12/1973 | Lin et al. | 365/8 |
| 3,883,858 | 5/1975 | Lienhard et al. | 365/87 |
| 3,953,840 | 4/1976 | Cutler et al. | 365/7 |
| 4,008,420 | 2/1977 | Navratil | 365/6 |
| 4,035,785 | 7/1977 | Kryder | 365/8 |

OTHER PUBLICATIONS

"Single Conductor and Ratch" Bubble Propagating Circuit, Ishihara et al.; 5/74; Intermag Conf. Proc. 844–847.

Primary Examiner—Marshall M. Curtis
Attorney, Agent, or Firm—Pollock, Vande Sande & Priddy

[57] ABSTRACT

The present invention provides thin film magneto-resistive readout apparatus for providing readout from magnetic memory devices such as magnetic tapes, the apparatus comprising a thin film magneto-resistive readout head element, a narrow pulse generator for applying sensing current to the readout head element in the form of trains of narrow pulses, and a signal averaging circuit connected to receive output signals from the readout head element for deriving an average output signal for the pulses in each train.

3 Claims, 2 Drawing Figures

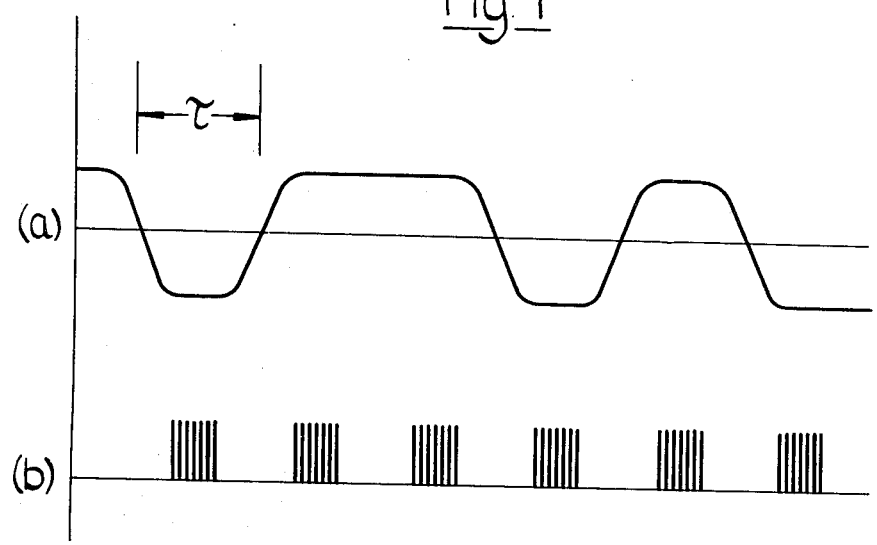
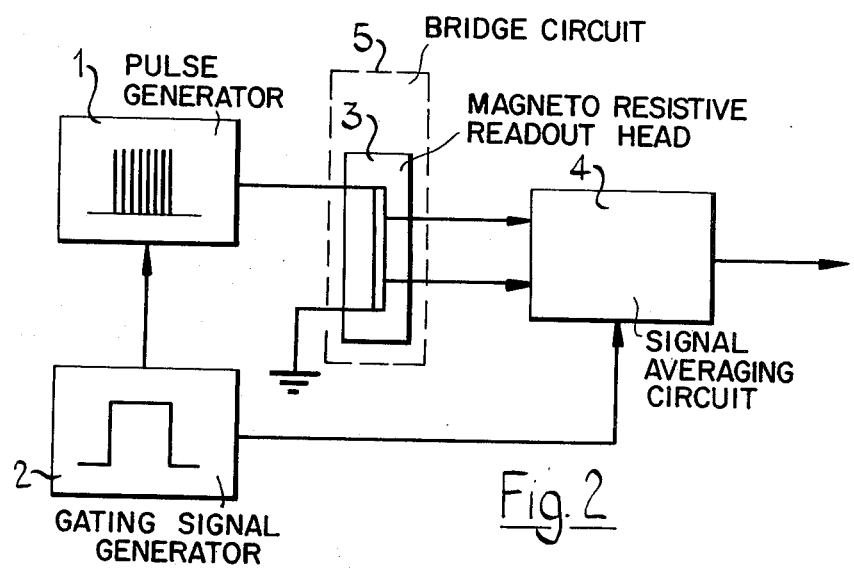

THIN FILM MAGNETO-RESISTIVE APPARATUS FOR EFFECTING READOUT FROM MAGNETIC MEMORY DEVICES

This application is a continuation-in-part of our copending application Ser. No. 7,448 filed Jan. 29, 1979 in the names of A J Collins and J D R-K McQuillin and entitled 'Magneto Resistive Readout Apparatus'.

This invention relates to magneto-resistive readout from magnetic memory devices, such as magnetic tape, disc, drum and bubble devices.

Magnetic readout heads which exploit magneto-resistance have the advantage over conventional reluctance sensors that they are sensitive to magnetic field strength directly, whereas reluctance sensors are sensitive to changes in the field strength, so magneto resistive heads should be less sensitive to mechanical variability than reluctance sensors. They do however, suffer from the disadvantage that since the magneto-resistance effect is quite small a large sensing current is needed in order to obtain a sufficiently large voltage response, but since the magneto-resistive element is in the form of a thin film it is liable to be damaged by an excessive current.

According to the present invention there is provided readout apparatus for a magnetic memory device, including a magneto-resistive readout head element in the form of a thin film, means for applying sensing current of about one Ampere to said readout head element in the form of trains of pulses, said pulses being sufficiently narrow to avoid electrical heating damage to said thin film readout head element, and signal averaging means connected to receive output signals from said readout head element for deriving an average output signal for the pulses in each train.

The present inventors have found that resistance to damage caused by passing high currents through devices such as magneto-resistive readout heads is greater when the current is in the form of short pulses than when it is continuous. This effect starts to be noticeable at a pulse width of about 100 microseconds and the resistance to damage steadily improves as the pulse width decreases, so that the device will withstand more power when it is in the form of ten-microsecond pulses than when it is in the form of hundred-microsecond pulses, more still when it is in the form of microsecond pulses, more still when it is in the form of hundred-nanosecond pulses and more still when it is in the form of ten-nanosecond pulses. The effect has only been experimentally observed down to ten-nanosecond pulses, but there is no sign of any abatement of the effect at that pulse width.

The pulses in the trains are preferably well separated. For example ten-nanosecond pulses may be used with a pulse repetition frequency of about ten megahertz.

An embodiment of the invention will now be described by way of example with reference to the accompanying drawings of which:

FIG. 1 is a diagram of some wave forms illustrating the principle of the invention, and FIG. 2 is a schematic circuit diagram of an embodiment of the invention.

In FIG. 1 the variation with time of the magnetic field in the neighbourhood of a readout head of magnetic tape, disc or drum store is illustrated at (a). The direction of the field during a bit period of length $\tau$ indicates whether the corresponding bit of the data stored on the memory device is a binary '1' or '0'. A typical value for the bit period is about one millisecond for a tape or disc store. The waveform of the sensing current in an exemplary embodiment of the invention is shown at (b). The current is in the form of bursts of a few microseconds duration, of short pulses of about ten nanoseconds in width, with a pulse repetition frequency within each burst of about ten megahertz. The bursts are timed to occur at about the center of a bit period.

FIG. 2 shows a pulse generator 1 arranged to produce a series of ten-nanosecond pulses with a pulse repetition frequency of ten megahertz and a gating signal generator 2 arranged to produce pulses of a few microseconds duration at about the middle of the data period of a storage device (not shown). The output from the gating signal generator 2 is connected to gate the stream of pulses generated by the pulse generator 1, thus to form a series of bursts of pulses, each burst being of a few microseconds duration. The gated output of the pulse generator 1 is a low impedance output, and is connected to a magneto-resistive readout head 3 which is part of a balanced bridge circuit 5 to apply sensing current in the form of bursts of pulses, the current during each pulse being about one Ampere. The bridge circuit is arranged to give a null output in the absence of a magnetic field. The output of the readout head 3 is connected to a signal averaging circuit 4 which is also connected to receive the gating signal from the gating signal generator 2 and is arranged to form an average of the output of the readout head 3 during each burst. The output of the signal averaging circuit 4 during each bit period is thus indicative of the average of the change in resistivity of the readout head 3 during the bit period, and therefore of the direction of the magnetic field during that bit period. The signal averaging circuit 4, and its operation, is known per se, and is described for example in the Hewlett-Packard Application Note "Signal Recovery by Signal Averaging" in AIM Technical Interface, Vol 1, No 2, 1969. The theory of the signal averaging techniques used in the circuit 4 is discussed in "The Statistical Theory of Communication" by Y W Lee, published by Wiley in 1969, and in "An Introduction to the Theory of Random Signals and Noise" by W Davenport and W L Root, published by McGraw-Hill in 1958.

A number of modifications of the described embodiment will be apparent to persons skilled in the art to which this invention relates. The invention may be applied to magnetic bubble memories in which the data period is of the order of a 100 microseconds.

We claim:

1. Readout apparatus for a magnetic memory device, said apparatus comprising a magneto-resistive readout head element in the form of a thin film, means for applying sensing current of about one Ampere to said readout head element in the form of trains of pulses, said pulses being sufficiently narrow to avoid electrical heating damage to said thin film readout head element, and signal averaging means connected to receive output signals from said readout head element for deriving an average output signal for the pulses in each train.

2. Readout apparatus as in claim 1 wherein said means for applying sensing current comprises a pulse generator arranged to produce pulses of about ten-nanosecond pulse-width at a pulse repetition frequency of about ten megahertz.

3. Readout apparatus as in claim 1 or claim 2 wherein said readout head is part of a balanced bridge circuit arranged to give a null output in the absence of a magnetic field.

* * * * *